United States Patent [19]
Yamamoto et al.

[11] 4,094,722
[45] June 13, 1978

[54] ETCHING APPARATUS USING A PLASMA

[75] Inventors: Shinichi Yamamoto; Yasusuke Sumitomo, both of Yokohama; Yasuhiro Horiike, Tokyo; Masahiro Shibagaki, Hiratsuka, all of Japan

[73] Assignee: Tokyo Shibaura Electric Co., Ltd., Tokyo, Japan

[21] Appl. No.: 762,386

[22] Filed: Jan. 26, 1977

[30] Foreign Application Priority Data

Jan. 29, 1976 Japan .................................. 51-7957

[51] Int. Cl.² .............................................. C23F 1/02
[52] U.S. Cl. ..................................... 156/345; 156/643; 156/646; 204/192 E
[58] Field of Search ................. 156/345, 643, 646; 204/298, 192 E, 157.1; 118/49.1, 50.1

[56] References Cited

U.S. PATENT DOCUMENTS

| | | | |
|---|---|---|---|
| 3,632,494 | 1/1972 | Herte et al. | 204/298 |
| 3,827,966 | 8/1974 | Needham | 204/298 |
| 3,906,892 | 9/1975 | Cakenbagle | 118/49.1 |
| 3,933,644 | 1/1976 | Skinner et al. | 204/298 |
| 3,971,684 | 7/1976 | Muto | 252/79.1 |
| 4,009,680 | 3/1977 | Fengler | 118/49.1 |

*Primary Examiner*—David Klein
*Assistant Examiner*—Jerome W. Massie
*Attorney, Agent, or Firm*—Finnegan, Henderson, Farabow & Garrett

[57] ABSTRACT

An etching device uses a gas activated by a plasma for etching a semiconductor element. The apparatus includes object feeding and etching chambers formed on the opposite sides of an airtight flat chamber and a support plate rotatably mounted in the flat chamber to bring the semiconductor element from the feeding chamber to the etching chamber in which the semiconductor element is etched by the vertically flowing activated gas.

10 Claims, 5 Drawing Figures

ETCHING APPARATUS USING A PLASMA

This invention relates to an etching apparatus and more particularly to an etching apparatus using a plasma.

Recently, a plasma-type etching process using, for example, tetrafluoromethane ($CF_4$) gas, commercially known as Freon gas has come to be more widely accepted in place of solution-type etching. This plasma-type etching process is applied in extremely fine working not only on a polycrystalline silicon layer, silicon nitride layer, and silicon oxide layer but also on a molybdenum layer and tungsten layer. The conventional plasma-type etching process indeed has the advantages of suppressing the occurrence of environmental pollution due to application of harmful chemicals such as hydrofluoric acid as in the case with solution type etching and eliminating the necessity of forming a silicon oxide layer between a photo resist and silicon nitride layer, when the latter is etched, thereby reducing a required number of operation steps. But the prior art plasma-type etching process has the drawbacks that an object of etching, for example, a semiconductor element placed in a plasma tends to be unnecessarily damaged; an uneven distribution of positive and negative fluorine ions in a high electric and magnetic field leads to irregular etching; where an operator watches etching condition, ultraviolet rays emitted during the plasma etching adversely affect his eyes; and it is impossible to carry out the continuous process of etching a plurality of objects successively brought into a plasma and taking out fully etched objects one after another, resulting in very inefficient etching.

It is accordingly an object of this invention to provide an etching apparatus which has the merits of the known plasma-type etching process and yet is free from the difficulties encountered in the past. An etching apparatus embodying this invention has been accomplished from the fact that a suitable gas, for example, tetrafluoromethane activated by charged particles retains an etching action during a certain length of time after drawn off from high electric and magnetic fields.

According to an aspect of the invention, there is provided an etching apparatus for etching an object using a plasma which comprises; an apparatus body including an airtight flat hollow chamber, and an object-feeding chamber and an etching chamber to be horizontally spaced from each other; a rotatable support plate provided in the flat hollow chamber to be rotated in a horizontal plane; an object holder provided on the rotatable support plate and brought into the object-feeding chamber when the rotatable support plate is rotated through a first angle and then into the etching chamber when said support plate is turned through a second angle; a plasma generator for activating an introduced gas, thereby causing the activated gas to have an etching action; gas flow-guiding means for conducting the activated gas into the etching chamber over the object of etching and drawing off the spent gas out of the etching chamber from below the object of etching; and gas flow-baffling means for preventing the gas from flowing from the etching chamber to the object-feeding chamber.

This invention can be more fully understood from the following detailed description when taken in conjunction with the accompanying drawings, in which.

Figure 1:
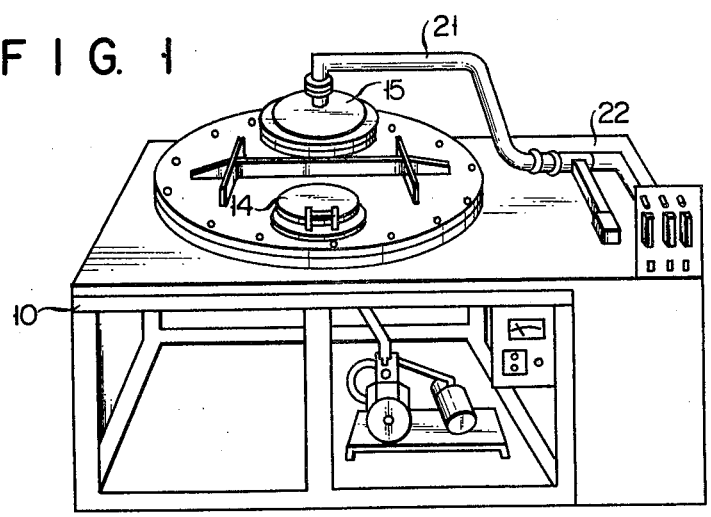
FIG. 1 is an oblique view of an entire etching apparatus embodying this invention.
Figure 2:
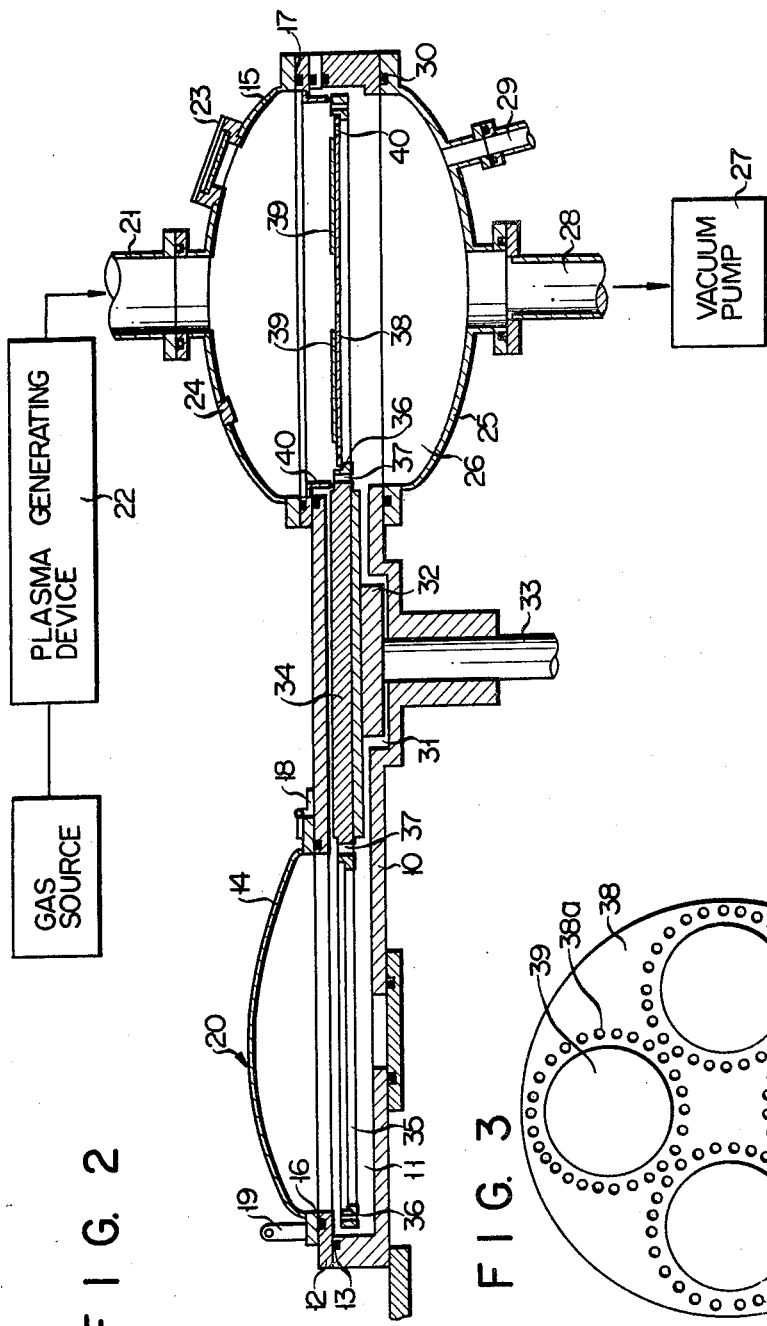
FIG. 2 is a fractional sectional view of FIG. 1.
Figure 3:
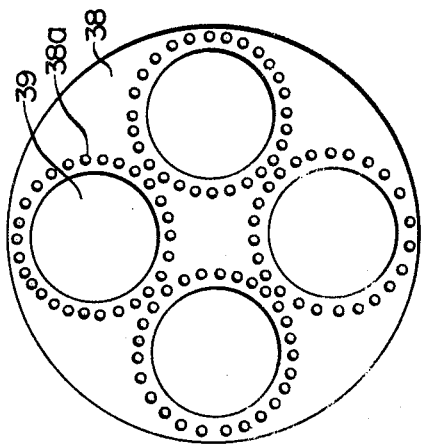
FIG. 3 is a plan view of a palette received in the plasma generator of FIG. 2.

There will now be described by reference to FIGS. 1 to 3 a continuous etching apparatus using a plasma embodying this invention.

A large circular depression 11 is formed in the upper surface of a support table 10. A disk-like cover 12 is mounted on the upper surface of the support table 10 with an O-ring 13 interposed therebetween to seal the depression 11 in airtightness, providing a hollow flat chamber. The cover 12 has a pair of symmetric circular openings bored on the right and left sides respectively of the central axis of said cover 12. A hatch 14 is hermetically fitted to one opening with an O-ring 16 interposed therebetween. A hatch 15 is similarly fitted to the other opening with an O-ring 17 interposed therebetween. Hatch 14 has one end fitted to the cover 12 by means of a hinge 18. If necessary, a handle 19 is grasped by the hand to swing said hatch 14 thereby to open the opening. The hatch 14, hinge 18, handle 19 and said one opening collectively constitute a feeding section 20 for an object of etching. One end of a gas feeder 21 is open to the central portion of the upper wall of the other hatch 15. The gas feeder 21 is connected as shown in FIG. 1, to a plasma generator or plasma generating device 22. High-frequency waves such as microwaves are impressed across a pair of parallel plate electrodes received in the plasma generator 22 to convert, for example, tetrafluoromethane ($CF_4$) gas and oxygen gas mixed in a substantially equal proportion into the form of plasma. The plasma generator 22 used with the etching apparatus of this invention may consist of any type well known to this particular field.

The upper wall of said other hatch 15 is provided with a peep window 23 for observing the interior of the hatch section and a photosenser 24 formed of a light-receiving element prepared from, for example, cadimum selenide (CdSe) for detecting the condition in which etching of an object is proceeding. The opposite side of the support table 10 to that on which the hatch 15 is provided is hermetrically fitted with another hatch 25 with an O-ring 30 interposed therebetween. Both hatches 15, 25 define an etching chamber 26. That portion of the lower hatch 25 which is disposed symmetric with the gas feeder 21 of the upper hatch 15 with respect to the horizontal axis of the etching chamber 26 communicates with one end of a gas discharge pipe 28 of a vacuum pump 27. When the subject etching apparatus is operated, a mixture of, for example, tetrafluoromethane gas and oxygen gas brought into the etching chamber 26 through the gas feeder 21 flows almost straight downward to be drawn off through the gas discharge pipe 28. The lower hatch 25 is further fitted with a vacuum gauge 29 to measure the degree of vacuum occurring in the etching chamber 26.

A second circular depression 31 is concentrically formed in the central part of the inner flat bottom plane of the first depression 11 of the support table 10. A disk-like rest 32 is loosely inserted into said second circular depression 31. The central part of the underside of the disk-like rest 32 is connected to the upper end of a rotatable shaft 33 concentrically penetrating the central part of the bottom wall of the second circular depression 31 of said support table 10 and rotatably supported by the support table 10 through bearings (not shown). A palette-supporting rotatable disk 34 is concentrically mounted on the upper surface of the rest 32. The palette-supporting rotatable disk 34 has an outer diameter slightly smaller than the inner diameter of the depression 11 almost fully to occupy said depression 11 and is so disposed therein as to effect a horizontal rotation. The rotatable disk 34 has a plurality of (four in this embodiment) circular openings 35 equidistantly arranged along the periphery. Each circular opening 35 has a slightly smaller diameter than the hatches 14, 15 and is positioned concentric with them when brought right below them. A stepped portion 36 is formed along the periphery of the circular opening 35, enabling the later described palette 38 to be so supported as to securely cover the whole of the opening 35. A large number of through holes 37 are bored around each circular opening 35 of the circular disk 34. The palette 38 mounted on each opening 35 assumes a circular shape as shown in FIG. 3. A large number of small through holes 38a are formed around those portions of said palette 38, on each of which a semiconductor wafer 39 is placed. These small through holes 38a and small through holes 37 bored in the support disk 34 define a gas passage extending between the upper and lower surfaces of said support disk 34. A cylindrical gas flow-baffling skirt 40 is fitted along the entire inner peripheral wall of the etching chamber 26 defined by the second and third hatches 15, 25 with the lower edge of said skirt 40 disposed a little above the upper surface of the rotatable disk 34. As seen from FIG. 2, the gas flow-baffling skirt 40 is spaced from the small through holes 37 of the rotatable disk 34. This arrangement prevents a gas introduced into the etching chamber 26 through the gas feeder 21 and activated by charged particles from being conducted through a gap between the rotatable disk 34 and disk-like cover 12 to any other palette 38 than that which is received in the etching chamber 26. For reliable baffling of a gas flow, a distance between the lower edge of the gas flow-baffling skirt 40 and rotatable disk 34 is preferred to be 0.5 mm to 1.0 mm. Obviously, for effective baffling of a gas flow, a distance between the upper surface of the support table 10 on one hand and the rest 32 and the underside of the rotatable disk 34 on the other and a distance between the upper surface of the rotatable disk 34 and the underside of the disk-like cover 12 should preferably be as narrow as possible.

Constituent members of the subject etching apparatus, for example, support table 10, disk-like cover 12, hatches 15, 25, rotatable disk 34 and cylindrical gas flow-baffling skirt 40 are desired to be formed of a material such as stainless steel, or aluminium which is little likely to be corroded by an etching gas and admits of high precision work.

There will now be described the operation of an etching apparatus embodying this invention constructed as described above. First, the hatch 14 of the chamber in which an object of etching is to be received is opened to place, for example, a semiconductor wafer 39 on a palette 38 mounted on each of a plurality of (four in this embodiment as shown in FIG. 3) openings 35. The rotatable disk 34 is rotated by means of the rotatable shaft 33 manually or by proper drive means, for example, a step motor, until a palette mounted on a given opening 35 is brought into a chamber in which the semiconductor wafer 39 is received, thereby placing said wafer 39 on the palette 38. The above-mentioned operation is repeated to put the semiconductor wafers 39 on all or more than half of the palettes. Under this condition, etching of the semiconductor wafer 39 is commenced. Prior to said etching, the etching chamber 26 is evacuated to a prescribed degree of, for example, $10^{-5}$ to $10^{-4}$ torr. Thereafter, the plasma generator 22 is operated to activate Freon gas and oxygen gas. An activated mixture of Freon gas and oxygen gas is conducted through the gas feeder 21 into the etching chamber 26 from above. The activated gas mixture is drawn off by the vacuum pump 27 from below the etching chamber 26 through the gas discharge pipe 28. The semiconductor wafers 39 placed on the palette 38 are etched by the above-mentioned activated gas mixture flowing substantially vertically from the feeder 21 to the gas discharge pipe 28. To effect the vertical flow of the activated gas mixture, the palette 38 is bored with a large number of small through holes 38a, and the rotatable table 34 is also bored with a large number of small through holes 37. Further, as previously mentioned, the gas flow-baffling skirt 40 is provided to prevent the activated gas mixture from being diverted from the proper flowing course. Unlike the prior art etching by high electric and magnetic fields themselves, etching by, for example, the above-mentioned activated gas mixture of this invention which has been drawn off from high electric and magnetic fields does not subject the semiconductor wafer to any excess etching, nor is carried out irregularly. Further, observation by an operator of the condition in which etching of an object is proceeding through the peep window 23 does not harmfully affect his eyes.

With the etching apparatus of the above mentioned embodiment, a chamber in which an object of etching is to be placed is not fully shut off from the etching chamber 26. Where, therefore, the operator puts a fresh object in said object-receiving chamber while the preceding object is being etched in the etching chamber 26, he is sometimes subject to the harmful chemical effect of the activated gas mixture. Consequently, where continuous etching is to be effected by loading a plurality of objects in succession while the preceding object is being etched, it is necessary futher to provide accessory equipment shown in FIGS. 4 and 5.

Figure 4:
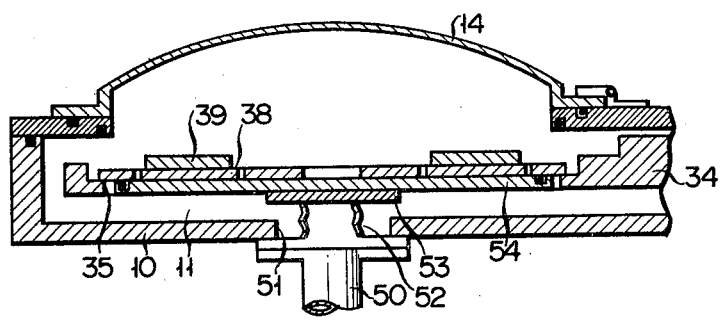
FIGS. 4 and 5 are fractional sectional views of a modification of the etching apparatus of the invention showing different operating conditions.
Figure 5:
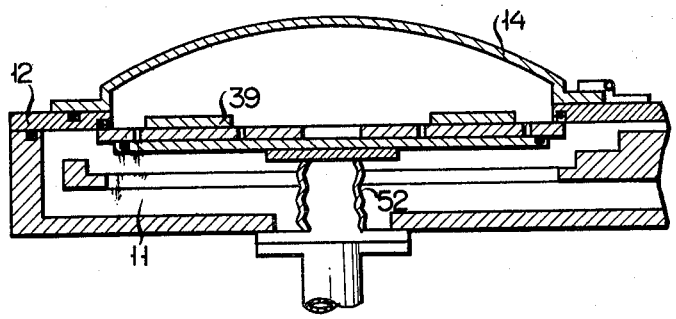

Referring to FIG. 4, referential numeral 50 is a pipe connected to a compressor (not shown). The inner end of the pipe 50 is connected to bellows 52 inserted into the depression 11 from the opening 51 of the support table 10. The upper end of the bellows 52 is hermetically closed by an end plate 53. The upper surface of the end plate 53 is fitted to the underside of a palette-supporting disk 54. This palette-supporting disk 54 has an outer diameter slightly smaller than the inner diameter of the opening 35 of the rotatable disk 34. While the etching apparatus is out of operation, the palette-supporting disk 54 is placed in the opening 35 of the rotatable disk 34. Where an object of etching 39 is loaded in an etching apparatus according to the embodiment of FIG. 4, constructed as described above, compressed air is carried into the bellows 52 from the compressor (not shown), thereby vertically lifting the palette-supporting disk 54 as shown in FIG. 5 and pressing the upper peripheral edge of the palette 38 against the underside of the disk-like cover 12 and consequently hermetrically sealing the interior of the hatch section 14 relative to the depression 11 of the support table 10. When the above-mentioned condition is attained, the hatch 14 is opened to put an object of etching 39 on the palette 38. After the hatch 14 is closed, the interior of the etching apparatus is brought back to the condition shown in FIG. 4. Thereafter, palette-supporting disk 54 is lowered from the opening 35 by the bellows 52 and the support disk 34 is rotated, as in the etching apparatus of FIGS. 1 and 2, to carry out the succeeding steps of operation.

The etching apparatus of the foregoing embodiment used a mixture of tetrafluoromethane ($CF_4$) commercially known as Freon gas and oxygen gas activated by charged particles as an etching agent. However, this invention is not limited to this type of plasma. Further, an object of etching may be placed on the rotatable support table 10 directly without using the palette 38 or by any other means. Where the palette 38 is used, it is not always necessary to provide a stepped portion in the periphery of the respective openings 35 of the rotatable support table 10. Further, said opening 35 need not be limited to a circular form.

What we claim is:

1. An apparatus for etching an object comprising:
   (a) a source of gas activatable for providing an etching action;
   (b) plasma generator means for receiving and activating said gas;
   (c) an apparatus body including an airtight hollow substantially flat chamber forming an object-feeding chamber and an object-etching chamber wherein an object for etching is presented to a flow of said activated etching gas, said object-etching chamber being spaced from said object-feeding chamber in a substantially horizontal plane and remote from said plasma generator means;
   (d) a support plate positioned in said hollow substantially flat chamber for rotation in said substantially horizontal plane;
   (e) at least one object holder provided on said support plate for positioning in said object-feeding chamber when said support plate is rotated through a first angle to receive an object to be fed and for positioning in said object-etching chamber when said support plate is rotated through a second angle to present an object for etching to the flow of said activated etching gas;
   (f) gas flow-guiding means for removing said activated etching gas from said plasma generator means, transferring said activated etching gas to said object-etching chamber, introducing the flow of said activated etching gas into said object-etching chamber substantially vertically above the object held by said object holder and withdrawing the flow of said gas from said object-etching chamber substantially vertically below the held object; and
   (g) gas flow-baffling means for ensuring said substantially-vertically downward flow of said activated etching gas past the held object in said object-etching chamber and for preventing said gas from flowing from said object-etching chamber to said object-feeding chamber.

2. An etching apparatus according to claim 1 further comprising means for maintaining the hermetic sealing of said object-feeding chamber when the object to be etched is being fed to said object holder in said object-feeding chamber.

3. An etching apparatus according to claim 1, wherein said apparatus body comprises a table, in the upper surface of which a circular depression is formed and a cover fitted to the upper surface of said table, said depression and cover jointly defining said hollow chamber.

4. An etching apparatus according to claim 3, wherein the cover is provided with first and second hatches, the first hatch being operable for placing the object of etching in the object-feeding chamber; and the table is provided with a third hatch, said second and third hatches being disposed to face each other for defining respectively upper and lower parts of the object-etching chamber.

5. An etching apparatus according to claim 4 further comprising means for hermetically sealing said object-feeding chamber when said first hatch is opened for positioning an object to be etched on said object holder.

6. An etching apparatus according to claim 4, wherein the gas flow-guiding means comprises a gas feeder pipe, one end of which is connected to the second hatch for introducing the flow of said activated etching gas into said object-etching chamber substantially vertically above the object held by said object holder and the other end of which is connected to the plasma generator means for removing said activated etching gas from said plasma generator means; a gas discharge pipe, one end of which is connected to the third hatch for withdrawing the flow of gas from said object-etching chamber substantially vertically below the held object; and a plurality of holes bored through the rotatable support table to conduct the flow of activated etching gas substantially vertically downwardly from the second hatch past the held object to the third hatch.

7. An etching apparatus according to claim 6, wherein the object-holder comprises a support opening formed near the periphery of the rotatable support plate; and a palette for holding objects to be etched, said palette being positioned to cover the support opening and provided with a plurality of through holes arranged around the objects mounted on the palette to conduct the flow of activated etching gas substantially vertically downwardly from said second hatch past the held object to the third hatch.

8. An etching apparatus according to claim 7, wherein the rotatable support plate has a stepped portion formed on the periphery of the support opening of said plate to support the periphery of the palette mounted on said support opening.

9. An etching apparatus according to claim 7 further comprising a vertically movable palette-supporting disk means actuatable for raising and lowering said palette from and to said support opening of said object holder in said object-feeding chamber, said disk means being actuated to raise and press said palette against said cover for hermetically sealing said object-feeding chamber when said first hatch is opened and an object is positioned on said raised palette and subsequently being actuated to lower and place said palette in said support opening of said object holder.

10. An etching apparatus according to claim 3, wherein the gas flow-baffling means comprises a skirt provided over the entire inner peripheral wall of the object-etching chamber, the lower edge of said skirt being disposed a little above the rotatable support plate.

* * * * *